United States Patent Office 3,372,062

Patented Mar. 5, 1968

3,372,062

NOBLE METAL THERMOCOUPLE HAVING BASE METAL LEADS

Edward D. Zysk, Livingston, N.J., assignor to Engelhard Industries, Inc., Newark, N.J., a corporation of Delaware

No Drawing. Filed June 22, 1964, Ser. No. 377,129

3 Claims. (Cl. 136—227)

The present invention relates to thermocouples and particularly to base metal lead wires to match the precious metal leg wires of a thermocouple disclosed in U.S. Patent No. 3,066,177 to J. F. Schneider et al., Nov. 27, 1962.

In the type of thermocouple with which the present invention is concerned a pair of dissimilar precious metal leg wires are joined at one end to form a thermoelectric couple at the junction which is referred to hereafter as the "hot-point." The legs are normally enclosed in a protective and insulating sheath and the thermoelectric response to temperature changes at the hot-point are measured by a potentiometer connected across the free ends of the legs.

The precious metal legs are expensive and it is desirable to have the legs short and be able to use less expensive base metal lead wires between the free ends of the legs and the voltmeter. It is a problem however to find base metal lead wires which match the leg wires to as not to distort the thermoelectric responses of the leg wires over the range of temperatures intended to be measured by the thermocouple.

When lead wires are used the connection between the lead wires and the respective leg wires are referred to as the "tie-points." For a suitable match the pattern of thermoelectric responses of a couple formed by the lead wires must match within allowable limits the pattern of thermoelectric responses of the leg wires over the range of temperatures expected at the tie-points when the hot-point is at a temperature within the range intended to be measured by the thermocouple. The temperature at the tie-points is determined by the ambient temperature and conduction of heat from the hot-point. The tie-point temperature will therefore be lower than, but proportionate to, the temperature at the hot-point.

It is a principal object of the present invention to provide base metal lead wires for a pair of the precious metal leg wires disclosed in the above Patent 3,066,177 which will closely match the thermoelectric response of the leg wires over a temperature range of from 0 to 250° C. at the tie-points. The precious metal legs are adapted to measure accurately temperatures in the upper limits of a range up to about 1300° C. at the hot-point, and it is simply a matter of testing to determine the appropriate length of the precious metal legs and amount of insulation to have the temperature at the tie-points within the range of 0° to 250° when the temperature at the hot-point is in the temperature range in which the thermocouple is intended for use.

The precious metal leg wires of the above Patent No. 3,066,177 with which the lead wires of the present invention are adapted to be used are:

| | | Percent |
|---|---|---|
| Positive leg: | | |
| Palladium | about | 82.5–83.5 |
| Platinum | do | 13.5–14.3 |
| Gold | do | 2.8–3.3 |
| Negative leg: | | |
| Gold | about | 64.5–65.5 |
| Palladium | do | 34.0–35.2 |
| Platinum | | 0 to about 0.99 |

All percentages of metals described herein are percentages by weight.

For the purpose of this invention the composition of the leg wires may be varied within the ranges shown above. However, to secure the close match between leg and lead wires in accordance with the present invention, the compositions of the positive and negative leg wires should be adjusted relative to each other so that the legs when coupled generate thermoelectric responses similar to the responses of an 83% palladium, 14% platinum, 3% gold leg coupled with a 65% gold, 35% palladium leg as shown in Table I below.

The base metal lead wires to match the above leg wires in accordance with the present invention are alloys as follows:

| | Percent |
|---|---|
| Positive lead wire for the positive leg: | |
| Copper | 97.4–98.8 |
| Nickel | 0.7–1.5 |
| Manganese | 0.5–1.1 |
| Carbon | 0–0.01 |
| Negative lead wire for the negative leg: | |
| Copper | 45–60 |
| Nickel | 40–55 |
| Iron | 0–15 |
| Manganese | 0–1.4 |
| Carbon | 0–0.1 |

With regard to standards by which the suitability of the match of lead wires for the above leg wires may be determined, a variance of ±0.025 millivolt between the thermoelectric response of a couple formed by the leg wires and a couple formed by the lead wires to temperatures expected at the tie-points is considered very close matching. And a variance up to about ±0.100 millivolt will not appreciably reduce the accuracy of the thermocouple.

The characteristics and close matching of the lead wires of this invention to the above leg wires are shown by the following Table I. For the tests summarized in the Table I the lead wires and the leg wires were set up as separate couples and tested over the same range of temperatures. During the test the reference junctions, i.e. the point of connection of the test wires to the potentiometer, were maintained at a constant temperature of 0° C.

TABLE I.—E.M.F. IN MILLIVOLTS, REFERENCE JUNCTION AT 0° C.

| Temperature, ° C. | Positive Leg Pd 83%, Pt 14%, Au 3% vs. Negative Leg Au 65%, Pd 35% | Positive Lead Cu 98%, Ni 1.25%, Mn 0.74%, C 0.01% vs. Negative Lead Ni 55%, Cu 45% | Difference |
|---|---|---|---|
| 0 | 0 | 0 | 0 |
| 10 | 0.334 | 0.330 | +0.004 |
| 20 | 0.673 | 0.660 | +0.013 |
| 30 | 1.017 | 0.994 | +0.023 |
| 40 | 1.366 | 1.353 | +0.013 |
| 50 | 1.719 | 1.729 | −0.010 |
| 60 | 2.077 | 2.084 | −0.007 |
| 70 | 2.440 | 2.460 | −0.020 |
| 80 | 2.807 | 2.820 | −0.013 |
| 90 | 3.179 | 3.179 | 0 |
| 100 | 3.556 | 3.564 | −0.008 |
| 150 | 5.522 | 5.575 | −0.053 |
| 200 | 7.580 | 7.698 | −0.118 |
| 250 | 9.705 | 10.004 | −0.299 |

Heretofore lead wires which have in practice been used with the above legs are Chromel and Alumel alloy wires. The Chromel alloy which has been used for a positive lead wire is composed of approximately 90% nickel and 10% chromium. The Alumel alloy which has been used as a negative lead wire is composed of approximately 94% nickel, 3% manganese, 2% aluminum and 1% silicon. The improved match provided by leads of the present invention is illustrated by comparing the figures in the above Table I with the figures in the following Table II which shows the thermoelectric responses of a Chromel vs. Alumel couple and of the couple formed by the above precious metal legs. As with the tests tabulated in Table I the reference junction was maintained at 0° C.

TABLE II.—E.M.F. IN MILLIVOLTS, REFERENCE JUNCTION 0° C

| Temperature, ° C. | Positive Leg Pd 83%, Pt 14%, Au 3% vs. Negative Leg Au 65%, Pd 35% | "Chromel" vs. "Alumel" | Difference |
|---|---|---|---|
| 30 | 1.017 | 1.199 | 0.182 |
| 50 | 1.719 | 2.019 | 0.300 |
| 100 | 3.556 | 4.098 | 0.542 |
| 150 | 5.522 | 6.135 | 0.613 |
| 200 | 7.580 | 8.133 | 0.553 |
| 250 | 9.705 | 10.156 | 0.451 |

An additional advantage of the lead wires of the present invention is the close individual match of the positive leg and lead wires and the negative leg and lead wires over a range of expected tie-point temperatures. This is illustrated in Table III below. This close individual match permits greater flexibility in the arrangement and use of thermocouple leg and lead wire combinations of the invention since the tie-points need not be at the same temperature. They may therefore be separated. For example, the couple may be arranged straight through a tube with the lead wires at opposite ends of the tube.

Table III below shows the thermoelectric characteristics of the leg wires and lead wires measured against a common reference leg of Standard Platinum 27. For these measurements each of the leg wires and each of the lead wires were in turn coupled with the platinum reference leg and E.M.F. readings taken for the range of temperatures shown.

TABLE III

| Temperature, ° C. | Lead Wires | | Leg Wires | |
|---|---|---|---|---|
| | Positive Cu 98.00%, Ni 1.25%, Mn 0.74%, C 0.01% vs. Pt 27 | Negative Cu 45%, Ni 55% vs. Pt 27 | Positive Pd 83%, Pt 14%, Au 3% vs. Pt 27 | Negative Au 65%, Pd 35% vs. Pt 27 |
| 30 | 0.0 | −0.994 | +0.107 | −0.910 |
| 40 | +0.004 | −1.349 | +0.146 | −1.220 |
| 50 | +0.013 | −1.716 | +0.199 | −1.520 |
| 60 | +0.024 | −2.066 | +0.217 | −1.860 |
| 70 | +0.036 | −2.424 | +0.240 | −2.200 |
| 100 | ---------- | ---------- | +0.386 | −3.170 |

What is claimed is:

1. A thermocouple comprising a thermocouple positive leg wire composed of 82.5–83.5% palladium, 13.5–14.3% platinum and 2.8–3.3% gold by weight and a thermocouple negative leg wire composed of 64.5–65.5% gold, 34.0–35.2% palladium and 0–0.99% platinum, said positive leg wire and said negative leg wire being electrically joined to form a hot junction, a positive lead wire composed of 97.4–98.8% copper, 0.7–1.5% nickel, 0.5–1.1% manganese, and 0–0.01% carbon by weight, said positive lead wire being joined to said positive leg wire to form a tie point, and a negative lead wire composed of 45–60% copper, 40–55% nickel, 0–15% iron, 0–1.4 manganese and 0–0.1% carbon by weight, said negative lead wire being joined to said negative leg wire to form a tie point.

2. A thermocouple as set forth in claim 1 in which said positive lead wire is composed of about 98% copper, 1.25% nickel, 0.74% manganese and 0.01% carbon by weight.

3. A thermocouple as set forth in claim 1 in which said negative lead wire is composed of about 55% nickel and 45% copper by weight.

References Cited

UNITED STATES PATENTS

| | | | |
|---|---|---|---|
| 1,025,715 | 5/1912 | Peake | 136—227 X |
| 1,315,205 | 8/1918 | Bristol | 136—241 X |
| 2,466,202 | 4/1949 | Brenner | 136—241 X |
| 3,017,269 | 1/1962 | Finch et al. | 136—241 X |
| 3,066,177 | 11/1962 | Schneider et al. | 136—241 |
| 3,266,891 | 8/1966 | Finch et al. | 136—241 X |

OTHER REFERENCES

Metals Handbook A.S.M. (1939), pp. 289, 136–236.

Roeser et al., J. of Research, N.B.S., vol. 14 (1935), pp. 272–279.

ALLEN B. CURTIS, *Primary Examiner.*

WINSTON A. DOUGLAS, *Examiner.*

A. M. BEKELMAN, *Assistant Examiner.*